US 6,429,743 B2

(12) United States Patent
Iga (10) Patent No.: US 6,429,743 B2
(45) Date of Patent: Aug. 6, 2002

(54) SIGNAL CONVERSION CIRCUIT FOR STABLE DIFFERENTIAL AMPLIFICATION AND SEMICONDUCTOR DEVICE PROVIDED WITH THE SAME AS INPUT BUFFER (75) Inventor: Hironori Iga, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,157

(22) Filed: Jan. 16, 2001

(30) Foreign Application Priority Data

Jul. 17, 2000 (JP) .......................... 2000-215458

(51) Int. Cl.$^7$ ............................... H03F 3/45
(52) U.S. Cl. .................. 330/257; 330/252; 330/253; 330/261
(58) Field of Search .................. 330/252, 253, 330/257, 261

(56) References Cited

U.S. PATENT DOCUMENTS 5,680,066 A * 10/1997 Akioka et al. ............... 327/78
6,184,744 B1 * 2/2001 Morishita ................... 327/541

FOREIGN PATENT DOCUMENTS

| JP | 63-279607 | 11/1988 |
| JP | 11-266127 | 9/1999 |

* cited by examiner

Primary Examiner—Robert Pascal
Assistant Examiner—Patricia Nguyen
(74) Attorney, Agent, or Firm—McDermott, Will & Emery (57) ABSTRACT An input buffer of a signal level conversion circuit according to the present invention includes: a differential amplification circuit of a current mirror amplifier amplifying a potential difference of first and second nodes respectively supplied with an external signal and a reference signal for outputting an internal signal; and a bias circuit applying the same bias potential to the first and second nodes. The bias potential is set in such a way that potentials at the first and second nodes are set to a level where a group of transistors forming the current mirror amplifier can operate in a saturation region regardless of the levels of the external signal and the reference signal.

10 Claims, 7 Drawing Sheets

SIGNAL CONVERSION CIRCUIT FOR STABLE DIFFERENTIAL AMPLIFICATION AND SEMICONDUCTOR DEVICE PROVIDED WITH THE SAME AS INPUT BUFFER

BACKGROUND OF THE INVENTION

1. Field of the Invention

The present invention relates to a signal level conversion circuit and, more specifically, to a signal level conversion circuit for performing a differential operation and a semiconductor device provided with the same as an input buffer.

2. Description of the Background Art

Generally, a semiconductor device such as a memory device is provided with an input buffer generating an internal signal in accordance with an externally applied input signal. The input buffer converts the potential level of the external signal in a specific range to fall within a range suitable for the internal operation of the semiconductor device.

In this case, the level of the internal signal is set based on a correlationship between the potential of the external signal and a reference potential. If, for example, L and H level potentials of the internal signal are respectively Vss and Vdd, the reference potential is determined as (Vdd+Vss)/2, and the potential of the external signal is compared with the reference potential for setting the level of the internal signal.

In a semiconductor device such as a DDR (Double Data Rate)-SDRAM (Synchronous Dynamic Random Access Memory), which operates in response to both activation and inactivation edges of an external clock EXT.CLK used as a reference, external clock EXT.CLK and its inverted clock /EXT.CLK are input and an internal clock signal is generated based on a correlationship between the potential levels of external clock signal EXT.CLK and inverted clock /EXT.CLK using inversion clock /EXT.CLK as a reference.

The generation of the internal signal at the input buffer is accompanied by a delay required for converting a correlationship between the potentials of the external and reference signals (potential difference) to the level of the internal signal. Thus, at the input buffer, as the potential levels of the input external signal and reference signal vary, the delay caused by the generation of the internal signal also varies. In a high speed device such as the above mentioned DDR-SDRAM, the timing of an output signal must be strictly adjusted with respect to the timing of an input signal, and therefore variation in delay of the internal signal at the input buffer cannot be ignored. In view of the above, an input buffer which is less affected by variation in the potential level of an input external signal is required.

Figure 9:
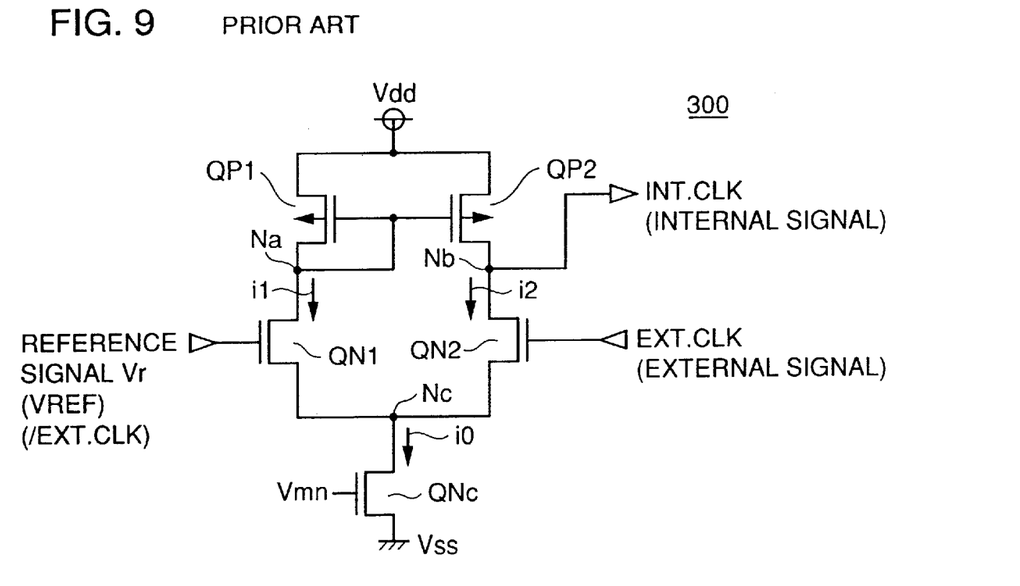
FIG. 9 is a circuit diagram showing a structure of a general differential input buffer 300 used for a semiconductor device.

FIG. 9 is a circuit diagram showing a structure of a general differential input buffer 300 used for a semiconductor device.

Referring to FIG. 9, input buffer 300 receives an external signal such as an external clock EXT.CLK and a reference signal Vr, and differentially amplifies the potential difference thereof for generating an internal clock INT.CLK of an internal signal. H and L level potentials of the internal signal are respectively a power supply potential Vdd and a ground potential Vss. Reference signal Vr is for example an inverted clock /EXT.CLK of external clock EXT.CLK or a constant direct current potential VREF at a level intermediate between power supply potential Vdd and ground potential Vss.

Input buffer 300 includes P type MOS transistors QP1 and QP2 respectively arranged between power supply potential Vdd and nodes Na, Nb; and N type MOS transistors QN1 and QN2 respectively arranged between a common node Nc and nodes Na, Nb. Transistors QP1 and QP2 have their gates connected to node Na. Transistors QN1 and QN2 have their gates respectively receiving a reference signal Vr and an external signal.

Input buffer 300 further includes an N type MOS transistor QNc electrically connected between common node Nc and ground potential Vss and having its gate receiving a constant direct current potential Vmn. Direct current potential Vmn is set at an intermediate potential level higher than a threshold value of transistor QNc. Thus, transistor QNc serves as a constant current source and supplies an operation current for differential amplification.

Transistors QN1, QN2, QP1, QP2, and QNc form a so-called current mirror amplifier.

If the gate potentials of transistors QN1 and QN2 are the same, currents i1 and i2 flowing through these transistors remain unchanged, having a value half a current i0 flowing through transistor QNc. Then, the potential level at node Nb generating the internal signal converges to a level where currents flowing through transistors QP1 and QP2 serving as a load equal to currents flowing through transistors QN1 and QN2.

Even if the gate potentials of transistors QN1 and QN2 vary, as long as the potentials thereof are the same, i.e., there is no potential difference, currents i1 and i2 have the same value, i.e., half current i0. Thus, the potential level at node Nb remains constant. Accordingly, when the external signal and reference signal change in the same manner, the internal operation of the input buffer would not be affected by variation in external potential level. In other words, a delay caused by the generation of the internal signal remains constant.

If the gate potential of transistor QN2, i.e., the potential of the external signal, increases to a level slightly above the gate potential of transistor QN1, i.e., the potential of the reference signal, current i2 flowing through transistor QN2 increases and current i1 flowing through transistor QN1 correspondingly decreases. On the other hand, since current i0 flowing through the circuit as a whole remains unchanged, the potential level at node Nb decreases in accordance with magnitudes of increase in current i2 of transistor QN2 and a load.

Conversely, if the gate potential of transistor QN2 decreases to a level slightly below the gate potential of transistor QN1, current i2 flowing through transistor QN2 decreases but current i1 flowing through transistor QN1 increases. Since current i0 flowing through the circuit as a whole remains unchanged, in this case, the potential level of internal node Nb increases in accordance with magnitudes of decrease in current i2 of transistor QN2 and a load. Thus, the internal signal generated at node Nb amplifies the gate potential difference between transistors QN1 and QN2, but does not affect in-phase component or direct current component.

However, to achieve stable operation of differential input buffer 300 with a high voltage gain, transistors QN1, QN2, QP1, QP2, and QNc, forming a current mirror amplifier, must operate in a saturation region.

Particularly, current supply transistor QNc serves as a constant current source through operation in the saturation region. To allow operation of current supply transistor QNc in the saturation region, the drain potential thereof, i.e., the potential level at common node Nc must equal Vmn−Vth (Vth: threshold voltage of transistor QNc). Generally, the potential level at common node Nc must be about several hundreds of mili-volts to assure operation current for a differential operation.

Further, the operation of transistor QN2 in the saturation region requires that the gate potential of transistor QN2, i.e., the potential of the external signal, must be at least a level higher by Vth' (Vth': a threshold voltage of transistor QN2) than the potential level at common node Nc. Assume that Vth is about 0.7V, as in a usual case. To ensure that transistor QN2 always operates in the saturation region, the gate potential must be at least about 1.0V regardless of the level of the external signal.

Recently, driving potentials and signal amplitude levels of interface systems have been on the decrease along with power supply potentials for the purpose of reducing power consumption. Thus, at a lower limit of a specified range of potential level, the gate potential of transistor QN2 cannot attain a sufficient level. As a result, a stable differential amplification operation cannot be achieved by input buffer 300.

In an SSTL2 (Stub Series Terminated Logic for 2.5V) as one of typical interface standards applied to a DDR-SDRAM device, for example, a power supply potential is set at 2.3V to 2.7V, so that a reference potential is set at 1.15V to 1.35V, which is half the power supply potential. The minimum amplitude of an AC (Alternating Current) signal is set at ±0.35V in the SSTL2. In other words, to comply with the SSTL2 standard, the AC signal of 1.15V±0.35V must also be input while appropriately identifying the H or L level thereof.

Thus, in inputting an L level corresponding to the minimum amplitude at the lower limit 1.15V, the gate potential of transistor QN2 would be 0.8V, which is lower than the gate potential required for the operation in the saturation region as previously mentioned. In this situation, input buffer 300 cannot perform a desired differential operation.

Figure 10:
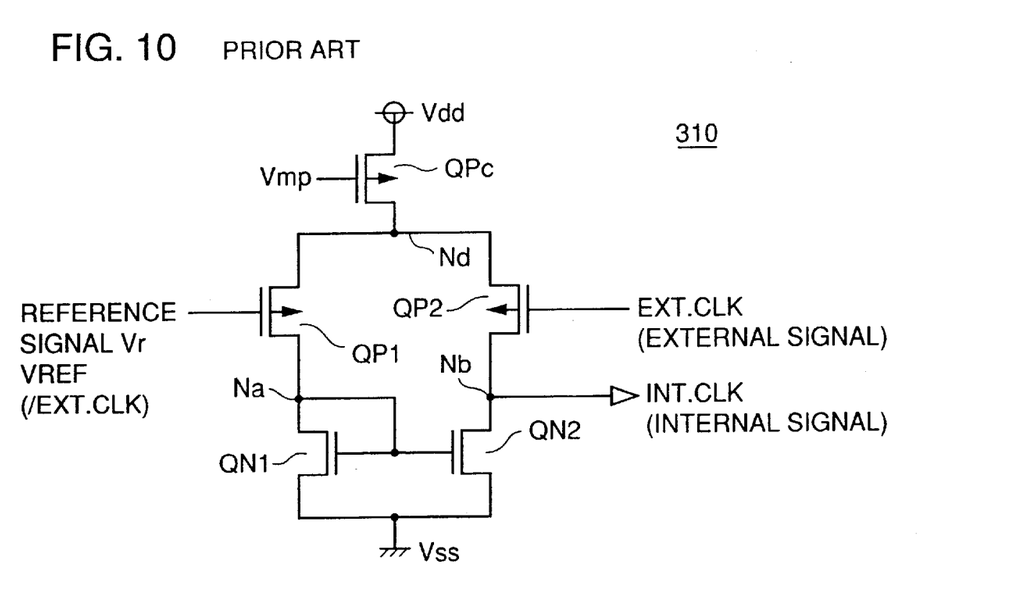
FIG. 10 is a circuit diagram showing a structure of another general differential input buffer 310 used for a semiconductor device.

FIG. 10 shows another exemplary structure of a conventional differential input buffer.

Referring to FIG. 10, an input buffer 310 differs from input buffer 300 shown in FIG. 9 in that it has a current supply transistor QPc formed of a P type MOS transistor and arranged on the side of power supply potential Vdd. P type MOS transistors QP1 and QP2 as well as N type MOS transistors QN1 and QN2 are arranged between a common node Nd and ground potential Vss. An external signal and a reference signal Vr are respectively applied to the gates of transistors QP2 and QP1. Transistors QN1 and QN2 have their gates connected to a node Na. Thus, the N type MOS transistor serves as a load at input buffer 310. For differential input buffer 310, similarly, transistors QN1, QN2, QP1, QP2, and QPc that form a current mirror amplifier must be operated in the saturation region to ensure a stable operation with a high voltage gain.

In the previous discussion of FIG. 9, it has been described that a sufficient differential operation of input buffer 300 may not be achieved even in the range specified by interface standard SSTL2. A similar problem may arise in the case of input buffer 310. More specifically, if the potential level of an input signal reaches an upper limit when the power supply potential is at a lower limit, similarly, a sufficient gate potential of transistor QP2 cannot be ensured. As a result, the transistors forming the current mirror amplifier cannot operate in the saturation region, whereby input buffer 310 cannot perform a desired differential operation.

Thus, a potential difference between the reference signal used for identifying the level of the external signal and one of power supply potential Vdd and ground potential Vss respectively corresponding to the H and L levels of the internal signal becomes small, the differential input buffer cannot generate the internal signal by a perfect differential operation. As a result, the operation speed of the input buffer, i.e., a delay caused by the generation of the internal signal, disadvantageously varies. Consequently, the general operation becomes unstable if a timing accuracy is strictly required for a semiconductor device provided with such an input buffer.

SUMMARY OF THE INVENTION

An object of the present invention is to provide a signal level conversion circuit suitable for an input buffer of a semiconductor device which stably generates an internal signal at high speed by a differential operation independent of a range of potential level of an input external signal.

In short, the present invention is a signal level conversion circuit generating an output signal based on a correlationship between the potentials of an input signal and a reference signal. The signal level conversion circuit includes a differential amplification circuit and a bias circuit. The differential amplification circuit amplifies a potential difference between a first node receiving the input signal and a second node receiving a reference signal for generating an output signal. The bias circuit applies bias potential to each of the first and second nodes.

According to another aspect, the present invention is a semiconductor device for operation which is provided with an input buffer generating an internal signal based on a correlationship between the potentials of an external signal and a reference signal. The input buffer includes: a differential amplification circuit amplifying the potential difference between a first node receiving the external signal and a second node receiving the reference signal for generating an internal signal; and a bias circuit applying bias potential to each of the first and second nodes.

According to still another aspect, the present invention is a signal level conversion circuit generating an output signal based on a correlationship between the potentials of an input signal and a reference signal. The signal level conversion circuit includes a differential amplification circuit, a first low pass filter, a first bias circuit, a first high pass filter, and a second bias circuit.

The differential amplification circuit amplifies a potential difference between first and second nodes for generating an output signal. The first low pass filter transmits a frequency component of the input signal that is at most a prescribed frequency. The first bias circuit applies a first bias potential to the first node in accordance with an output potential of the first low pass filter. The first high pass filter transmits to the first node a frequency component of the input signal that is at least a prescribed frequency. The second bias circuit applies a second bias potential to the second node in accordance with the potential level of the reference signal. A relationship between the first bias potential and the output potential of the first low pass filter is similar to that between the second bias potential and the potential level of the reference signal.

Therefore, a main advantage of the present invention is that an output signal can be generated by a desired differential amplification operation even if the amplitude of an input signal is low because a potential at the input node of a differential amplification circuit is set at least to a prescribed potential and variations in potential levels of a reference signal and the input signal can be reflected in the input node of the differential amplification circuit.

Further, in the input buffer generating an internal signal of the semiconductor device in accordance with an external signal, the potential at the input node of the differential amplification circuit is set at least to a prescribed potential, so that variations in signal levels of the reference signal and external signal can be reflected in the input node of the differential amplification circuit. Thus, even if the amplitude of the external signal is low, the internal signal can be generated by the desired differential amplification operation.

Moreover, the potential at the input node of the differential amplification circuit is set at least to a prescribed potential, so that both low and high frequency components of the input signal can be superimposed for transmission to the input node of the differential amplification circuit. As a result, even if the potential level of the input signal irregularly varies independently of a given frequency, an output signal can be generated in accordance with the variation in potential level of the input signal by a desired differential amplification operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in detail with reference to the drawings. It is noted that the same or corresponding portions are denoted by the same reference characters throughout the drawings.

First Embodiment

Figure 1:
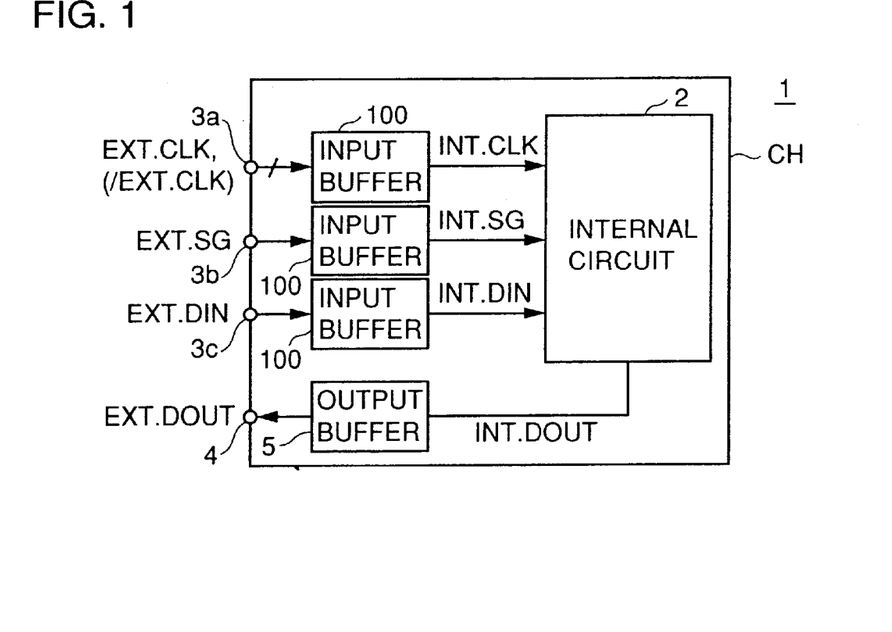
FIG. 1 is a schematic block diagram showing a general structure of a semiconductor 1 provided with a signal level conversion circuit as an input buffer according to a first embodiment of the present invention.

Referring to FIG. 1, a semiconductor device 1 includes an internal circuit 2 for performing a prescribed operation, a plurality of input terminals 3a, 3b, 3c, a data output terminal 4, and an output buffer 5. Input buffers 100 are arranged corresponding to input terminals 3a, 3b, 3c.

Input terminal 3a is a clock input terminal and receives an external clock EXT.CLK for a synchronous operation of internal circuit 2. Depending on the standard of semiconductor device 1, both of external clock EXT.CLK and an inverted clock thereof /EXT.CLK may be input. Input terminal 3b receives a control signal EXT.SG. Control signal EXT.SG collectively represent an externally input command control signal, an address signal, and the like. Input terminal 3c receives an externally input data EXT.DIN.

Input buffers 100 corresponding to input terminals 3a, 3b, 3c generate internal clock INT.CLK, internal control signal INT.SG, and internal data INT.DIN for transmitting them to internal circuit 2. Internal circuit 2 operates in response to these internal clock, internal control signal and internal data for outputting internal output data INT.DOUT as necessary.

Output buffer 5 receives internal output data INT.DOUT for transmitting external output data EXT.DOUT to output terminal 4.

Figure 2:
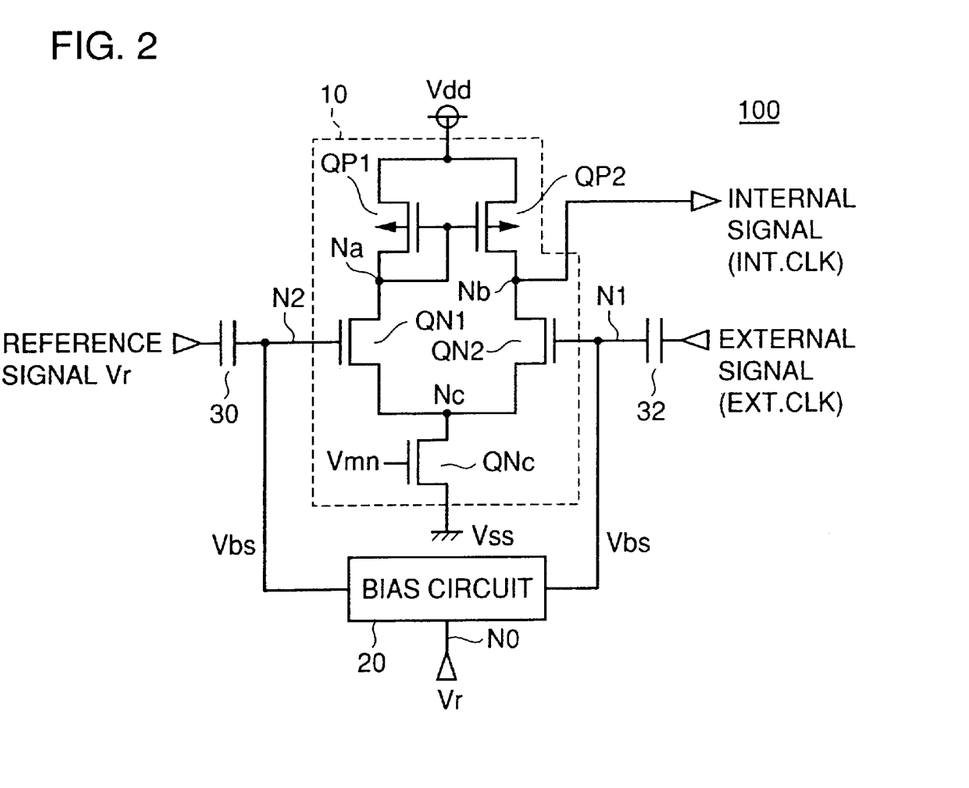
FIG. 2 is a circuit diagram showing a structure of an input buffer 100 according to the first embodiment of the present invention.

Referring to FIG. 2, input buffer 100 includes: a differential amplification circuit 10 amplifying a potential difference of nodes N1 and N2 for outputting an internal signal; a bias circuit 20 applying a common bias potential Vbs to nodes N1 and N2; and coupling capacitors 30 and 32 respectively arranged corresponding to nodes N1 and N2.

In FIG. 2, external and internal signals are respectively EXT.CLK and INT.CLK, by way of example. H and L level potentials of the internal signal are respectively a power supply potential Vdd and a ground potential Vss. Reference signal Vr is for example inverted clock /EXT.CLK of external clock EXT.CLK, or a constant direct current potential VREF at a level intermediate between power supply potential Vdd and ground potential Vss.

The structure of differential amplification circuit 10 is the same as differential input buffer 300 of FIG. 9, and therefore detailed description thereof will not be repeated. In FIG. 2, transistors QN1 and QN2 have their gates respectively connected to nodes N2 and N1. EXT.CLK as an external signal is input to node N1 through a coupling capacitor 32. Similarly, reference signal Vr is input to node N2 through coupling capacitor 30.

Bias circuit 20 supplies a bias potential Vbs to nodes N1 and N2 such that the potentials at nodes N1 and N2 are set at least to prescribed values regardless of the levels of input external signal and reference signal. The prescribed values are set in such a way that differential amplification circuit 10 can always perform a sufficient differential operation, i.e., that transistors QN1, QN2, QP1, QP2, and QNc forming a current mirror amplifier operate in a saturation region, in consideration of the size of transistors and the like.

The level of bias potential Vbs may be set in accordance with, or regardless of, the potential of reference signal Vr. For example, in a semiconductor device in conformity with the SSTL2 standard, bias potential Vs may be set to about 1.5V if the threshold voltage of the transistor is about 0.7V.

Now, an exemplary structure of bias circuit 20 will be described in detail.

Figure 3A:
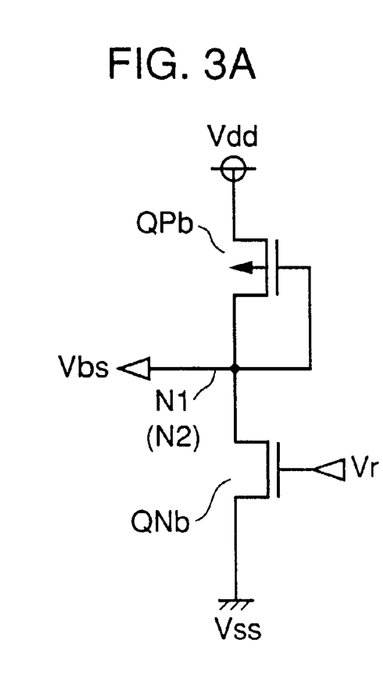
FIGS. 3A to 3D are circuit diagrams showing exemplary structures of a bias circuit 20.

Referring to FIG. 3A, bias circuit 20 includes: a P type MOS transistor QPb connected between power supply potential Vdd and node N1 (N2) outputting bias potential Vbs; and an N type MOS transistor QNb connected between node N1 (N2) and ground potential Vss. Transistor QNb has its gate receiving reference signal Vr, and transistor QPb has its gate connected to node N1 (N2). An amount of current flowing through transistor QNb varies according to the potential level of reference signal Vr, and the potential at node N1 (N2) converges to the level where the amounts of current flowing through transistors QPb and QNb are the same. Thus, bias potential Vbs according to the potential level of reference signal Vr can be output to node N1 (N2).

Figure 3B:
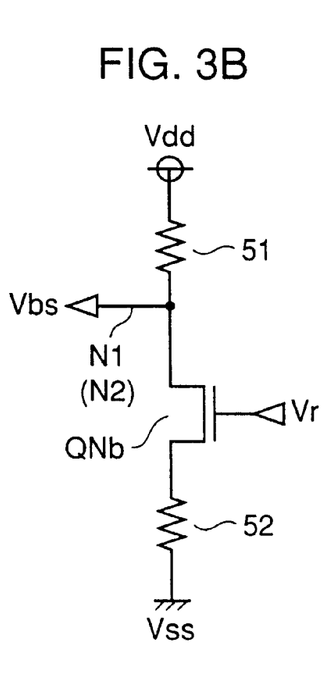

Referring to FIG. 3B, bias circuit 20 includes a resistor 51 connected between power supply potential Vdd and node N1 (N2), as well as an N type MOS transistor QNb and a resistor 52 connected in series between node N1 (N2) and the ground potential. Transistor QNb has its gate receiving a reference signal Vr. Such a structure also enables the amount of current flowing through transistor QNb to vary according to the potential level of reference signal Vr, so that bias potential Vbs according to the potential level of reference signal Vr can be output to node N1 (N2).

Figure 3C:
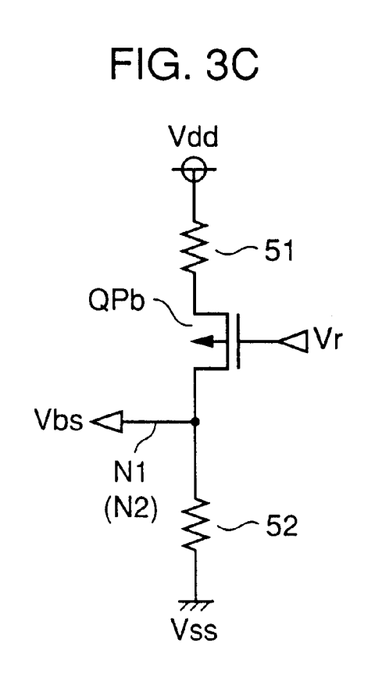

Referring to FIG. 3C, bias circuit 20 includes a resistor 51 and a P type MOS transistor QPb connected in series between power supply potential Vdd and node N1 (N2), and a resistor 52 connected between node N1 (N2) and ground potential Vss. Transistor QPb has its gate receiving reference signal Vr. Such a structure also enables bias potential Vbs generated at node N1 (N2) to be dependent on the potential level of reference signal Vr.

Figure 3D:
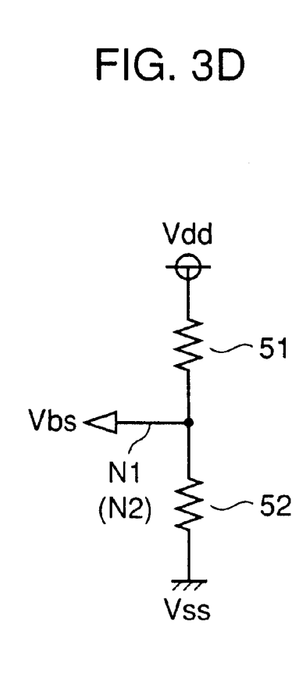

On the other hand, a bias circuit 20 shown in FIG. 3D includes a resistor 51 connected between power supply potential Vdd and node N1 (N2), and a resistor 52 connected between node N1 (N2) and ground potential Vss. The structure shown in FIG. 3D allows bias potential Vbs to be determined based solely on a ratio of the resistance values of resistors 51 and 52, regardless of the potential level of reference signal Vr.

With such a structure, bias potential Vbs may be set at a potential level sufficient for differential amplification circuit 10 to perform a differential operation according to the potential level of the external signal.

Any of the structures shown in FIGS. 3A to 3D may be employed for bias circuit 20. It is noted that nodes N1 and N2 respectively receiving the external signal and reference signal must be electrically separated. To this end, bias circuit 20 must have a first circuit generating bias potential Vbs applied to node N1 and a second circuit generating bias potential Vbs applied to node N2, which are independent of each other. Note that it is imperative that these first and second circuits generate the same bias potential Vbs. Accordingly, it is desired that the first and second circuits be structured with the same design. If desired, feedback loop for equalizing bias potentials Vbs generated by the first and second circuits may be provided in bias circuit 20.

Returning to FIG. 2, bias circuit 20 outputs bias potential Vbs to nodes N1 and N2. When EXT.CLK as an external signal and reference signal Vr are changing at a frequency equal to or higher than a prescribed frequency, the high frequency components thereof are respectively transmitted to nodes N1 and N2 through coupling capacitors 30 and 32. These high frequency components are transmitted to nodes N1 and N2 with their amplitudes not lowered almost at all, so that transistors QN1 and QN2 of differential amplification circuit 10 have their gates receiving potential signals generated by superimposing these high frequency components (alternating current components) onto bias potential Vbs, which is a direct current potential output from bias circuit 20.

Accordingly, if bias circuit 20 is structured such that bias potential Vbs is sufficiently high with respect to the threshold voltage of the transistors forming the current mirror amplifier, a desired differential amplification operation is always performed by differential amplification circuit 10 independent of a range of reference potential in accordance with the interface standard. Thus, an input signal with less variation in delay with respect to the external signal can be generated at high speed.

Further, coupling capacitors 30 and 32 function to rapidly reflect in the output signal any periodic change in the input signal and reference signal.

Second Embodiment

Figure 4:
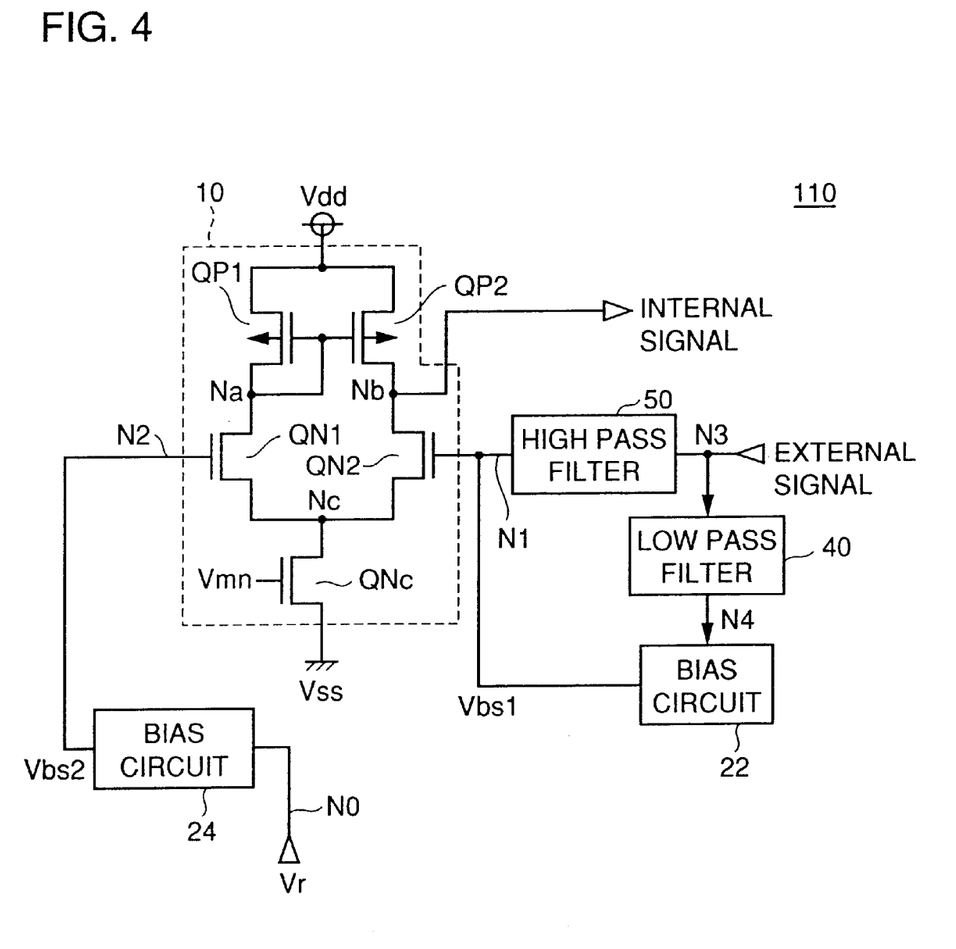
FIG. 4 is a circuit diagram showing a structure of an input buffer 110 of a signal level conversion circuit according to a second embodiment of the present invention.

Referring to FIG. 4, an input buffer 110, which is a signal level conversion circuit according to the second embodiment of the present invention, includes: a differential amplification circuit 10 generating an internal signal in accordance with a potential difference of nodes N1 and N2; a bias circuit 22 arranged corresponding to node N1; a bias circuit 24 arranged corresponding to node N2; and a low pass filter 40 and a high pass filter 50 arranged corresponding to an external signal.

Bias circuits 22 and 24 respectively output bias potentials Vbs1 and Vbs2, while receiving as inputs the potential levels of node N4 and reference signal Vr. Bias circuits 22 and 24 output bias potentials Vbs1 and Vbs2 at the same level, while receiving the same potential as inputs.

Now, exemplary structures of bias circuits 22 and 24 will be described in detail.

Figure 5A:
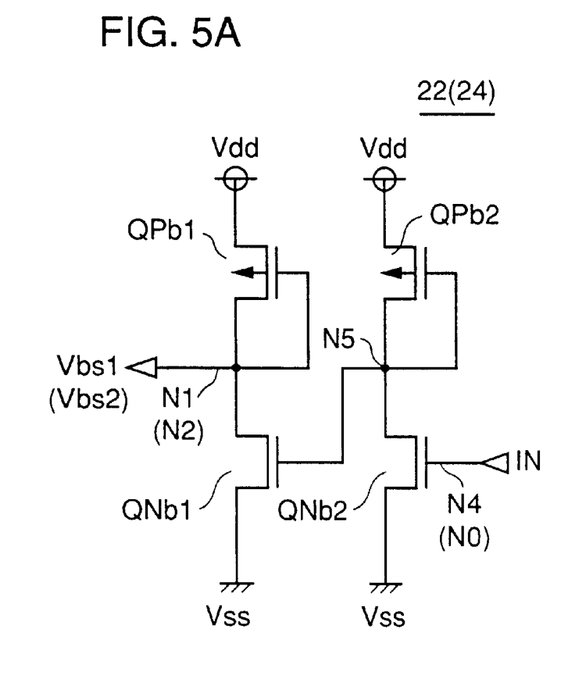
FIGS. 5A to 5C are circuit diagrams showing exemplary structures of bias circuits 22 and 24.

In FIG. 5A, transistors form the bias circuit, by way of example.

Referring to FIG. 5A, bias circuit 22 includes a P type MOS transistor QPb2 connected between power supply potential Vdd and node N5, and a transistor QNb2 electrically connected between N5 and ground potential. Vss. Transistor QNb2 has its gate connected to node N4 and receiving an output potential of low pass filter 40. Bias circuit 22 further includes a P type MOS transistor QPb1 electrically connected between power supply potential Vdd and node N1 receiving a bias potential, and a transistor QNb1 electrically connected between node N1 and ground potential Vss.

Transistors QNb1 and QPb2 have their gates connected to node N5. On the other hand, transistor QPb1 has its gate connected to node N1. Currents flowing through transistors QPb2 and QNb2 have the same value according to the potential level at node N4. Currents flowing through transistors QNb1 and QPb1 also vary according to the potential level at node N5, so that bias circuit 22 can output bias potential Vbs1 according to the potential level at node N4.

Figure 5B:
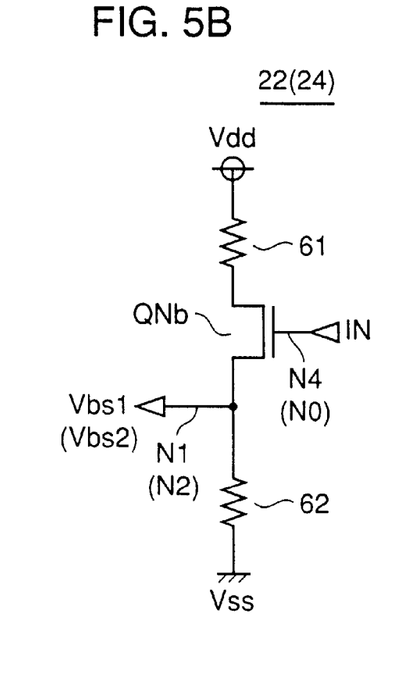
Figure 5C:
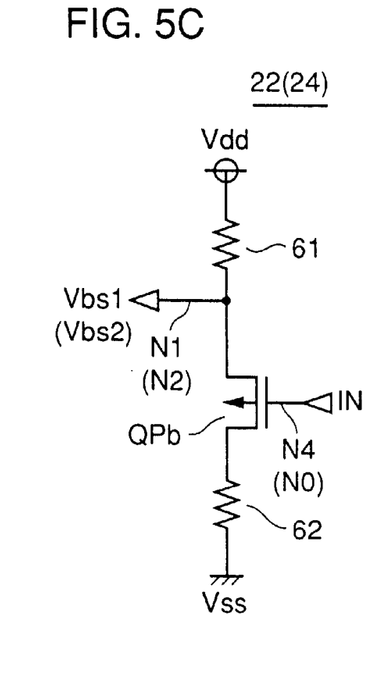

In FIGS. 5B and 5C, bias circuits are formed by resistors and transistors, by way of example.

Referring to FIG. 5B, bias circuit 22 includes a resistor 61 and an N type MOS transistor QNb connected in series between power supply potential Vdd and node N1, and a resistor 62 connected between node N1 and ground potential Vss. Transistor QNb has its gate connected to node N4. Such a structure enables an amount of current flowing through transistor QNb to be controlled according to the potential level at node N4, so that the potential level at node N1 generating bias potential Vbs1 can be varied according to the potential level at node N4.

Referring to FIG. 5C, bias circuit 22 includes a resistor 61 connected between power supply potential Vdd and node N1, as well as a P type MOS transistor QPb and a resistor 62 connected in series between node N1 and ground potential Vss. Transistor QPb has its gate connected to node N4. Such a structure also allows the potential level at node N1 generating bias potential Vbs1 to vary according to the potential level at node N4.

It is noted that the exemplary structures of bias circuit 22 have been described with reference to FIGS. 5A to 5C. However, if nodes N2 and N0 are connected respectively in place of nodes N1 and N4, a similar structure can be obtained for bias circuit 24.

If bias circuits 22 and 24 have identical structures, they are likely to exhibit similar output characteristics, i.e., relationships between input potentials and bias potentials. Further, as in the first embodiment, bias potentials Vbs1 and Vbs2 are set at the level that enables differential amplification circuit 10 to perform a sufficient differential operation, i.e., the level that enables transistors QN1, QN2, QP1, QP2 and QNc forming the current mirror amplifier to operate in the saturation region, regardless of the signal levels of the external signal and reference signal to which the potentials at nodes N1 and N2 are input.

Returning to FIG. 4, a high frequency component of the external signal is directly transmitted to node N1 through high pass filter 50, whereas a low frequency component of the external signal is transmitted to bias circuit 22 through low pass filter 40. The low frequency component of the external signal affects bias potential Vbs1 output from bias circuit 22.

Here, if the L or H level is successively input even when the external signal is a data signal, for example, bias circuit 22 outputs bias potential Vbs1 according to the level of the input external signal to node N1 to vary the gate potential of transistor QN2 in differential amplification circuit 10.

On the other hand, if the external signal changes at a frequency equal to or higher than a prescribed frequency, the high frequency component thereof is superimposed on bias potential Vbs1 output from bias circuit 22 to vary the gate potential of transistor QN2.

Figure 6:
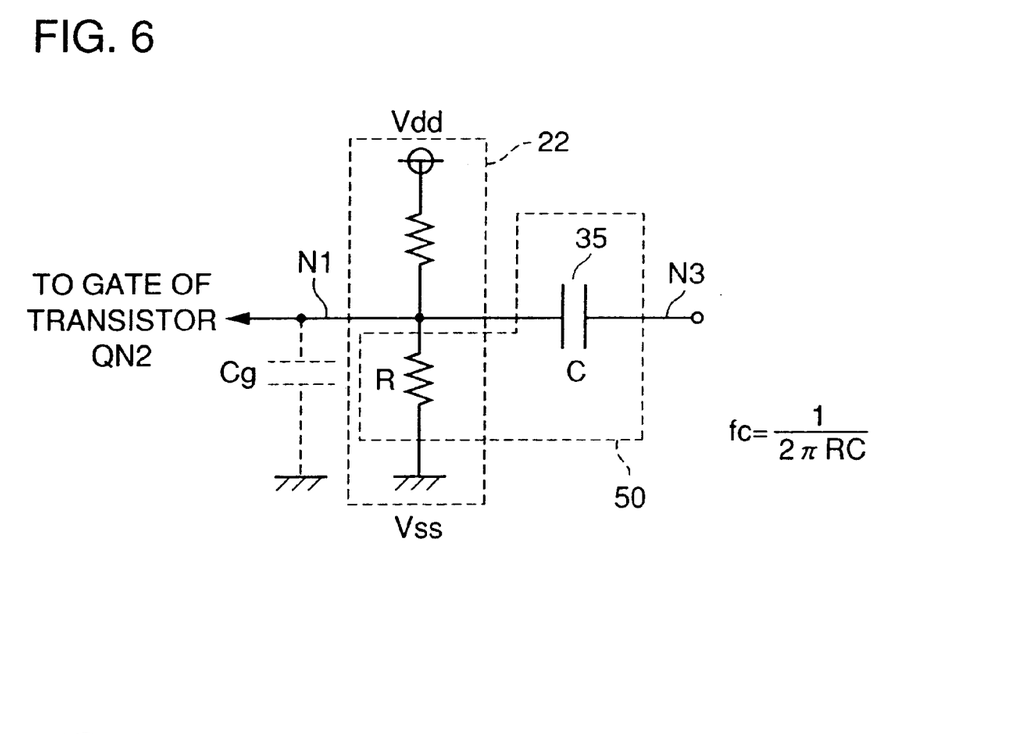
FIG. 6 is a circuit diagram shown in conjunction with the structure of a high pass filter 50.

Referring to FIG. 6, high pass filter 50 includes a coupling capacitor 35 connected between nodes N3 and N1 and having a capacitance value C, and a resistance R existing between node N1 and ground potential Vss in bias circuit 22. Node N1 also has a gate capacitance Cg of transistor QN2. However, gate capacitance Cg is considerably small as compared with capacitance C of the coupling capacitor, and therefore a cut-off frequency fc of high pass filter 50 is approximately expressed by an equation $fc=1/(2 \cdot \pi \cdot R \cdot C)$.

Figure 7:
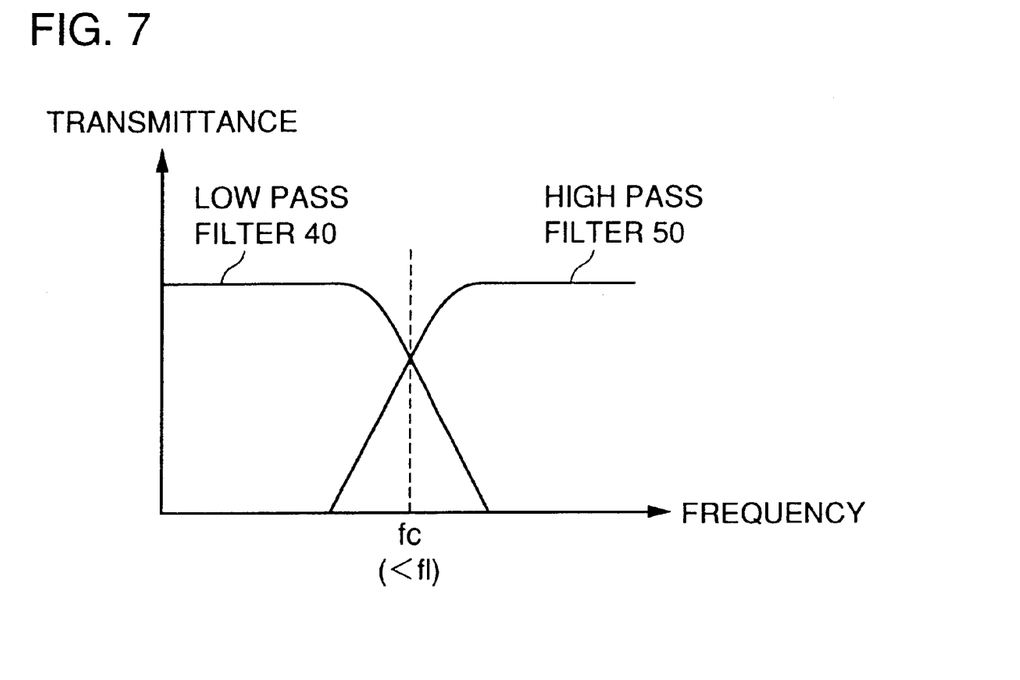
FIG. 7 is a graph shown in conjunction with frequency characteristics of a low pass filter 40 and high pass filter 50.

Referring to FIG. 7, cut-off frequencies of low pass filter 40 and high pass filter 50 are set to fc. When used in the semiconductor device, cut-off frequency fc is set to a value lower than a lower limit fl of an operation frequency determined as a specification of semiconductor device 1. Thus, the frequency component of at least lower limit operation frequency fl of the external signal of semiconductor device 1 is input to differential amplification circuit 10 through high pass filter 50. Accordingly, the variation in the external signal due to the frequency of at least lower limit operation frequency fl can affect the internal signal.

On the other hand, the external signal at the frequency lower than lower limit frequency fi affects bias potential Vbs1 generated by bias circuit 22 and is input to differential amplification circuit 10.

Such a structure enables both the high and low frequency components of the external signal to affect generation of the internal signal while always ensuring the differential operation of differential amplification circuit 10 with a desired bias potential being applied.

Figure 8:
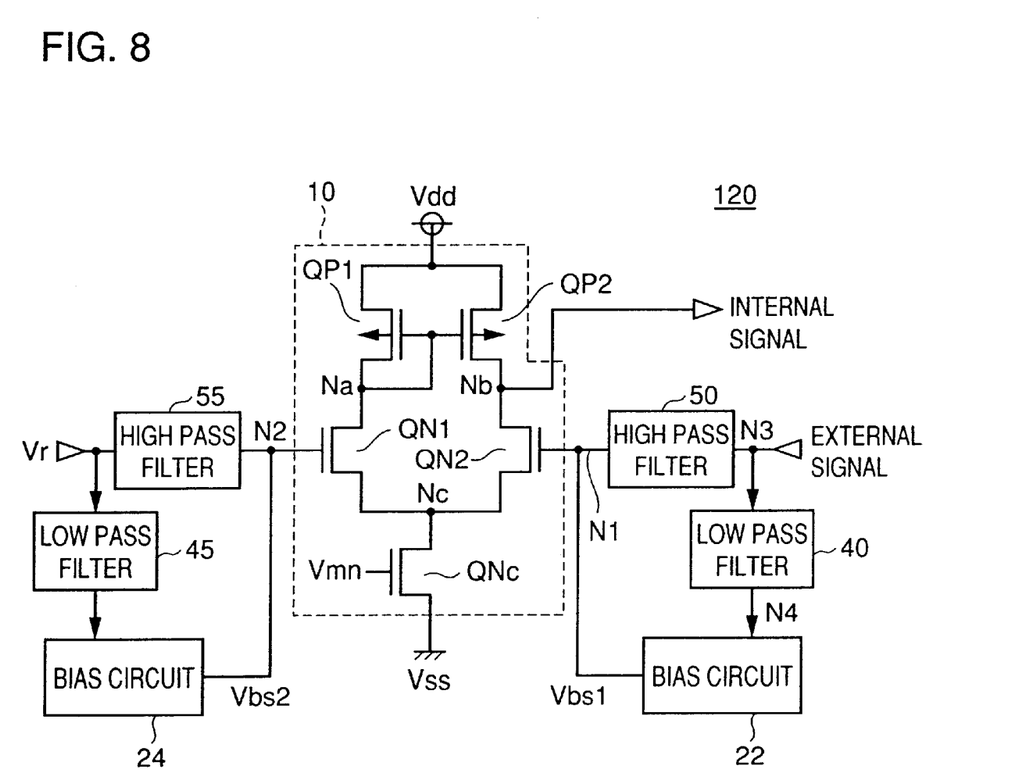
FIG. 8 is a circuit diagram showing an arrangement of an input buffer 120 of another exemplary structure of the signal level conversion circuit according to the second embodiment.

FIG. 8 is a circuit diagram showing a structure of input buffer 120 of another exemplary signal level conversion circuit according to the second embodiment.

In input buffer 120, a structure similar to that for the external signal is provided for reference signal Vr. Input buffer 120 further includes a low pass filter 45 and a high pass filter 55, not provided in the input buffer shown in FIG. 4. Low pass filter 45 and high pass filter 55 respectively transmit low and high frequency components of reference signal Vr to bias circuit 24 and node N2. The structures and cut-off frequencies of low pass filter 45 and high pass filter 55 are designed in the similar manner as low pass filter 40 and high pass filter 50, and therefore detailed description thereof will not be repeated. Bias circuit 24 outputs bias potential Vbs2 applied to node N2 according to the output potential of low pass filter 45, i.e., the low frequency component of reference signal Vr.

Such a structure enables input buffer 120 to generate the internal signal while always ensuring a differential operation of differential amplification circuit 10 even when reference signal Vr is an AC signal such as inverted clock /EXT.CLK of the external clock.

As described above, according to the input buffer of the present invention, the amplitude of the external signal can be input while applying an appropriate bias potential to the differential input buffer circuit independently of the range of potential level of the interface standard that the external signal must comply with, so that the internal signal can be generated while always ensuring a perfect differential operation. Further, the input buffer of the present invention can cope with the problem that, when the level of the input external signal is further decreased, the margin with respect to the threshold voltage of the transistor is reduced even if the differential amplification does not occur.

It is noted that, in the first to third embodiments, a structure of differential buffer 300 shown in FIG. 9 using the P type MOS transistor as a load is employed for differential amplification circuit 10. However, the structure of differential buffer 310 shown in FIG. 9 using the N type MOS transistor as a load may be employed in place of differential amplification circuit 10. In this case, a similar effect can also be produced if the potentials generated by bias circuits 20, 22 and 24 are set in such a way that a group of transistors forming the current mirror amplifier can operate in the saturation region regardless of the levels of the external signal and reference signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal level conversion circuit generating an output signal based on a correlationship between potentials of an input signal and a reference signal, comprising:

a differential amplification circuit amplifying a potential difference between a first node receiving said input signal and a second node receiving said reference signal for generating said output signal; and a bias circuit applying a bias potential independent of said output signal to each of said first and second nodes.

2. The signal level conversion circuit according to claim 1, wherein said bias circuit maintains potentials at said first and second nodes at least to prescribed potentials regardless of levels of said input signal and said reference signal, said differential amplification circuit includes a plurality of transistors forming a current mirror amplifier, and said plurality of transistors operate in a saturation region when said potentials at said first and second nodes are at least said prescribed potentials.

3. The signal level conversion circuit according to claim 2, wherein said bias circuit sets said bias potential in accordance with a potential of said reference signal.

4. The signal level conversion circuit according to claim 2, wherein said bias circuit sets said bias potential at a given value regardless of a potential of said reference signal.

5. The signal level conversion circuit according to claim 1, further comprising:

a first coupling capacitor connected to said first node; and a second coupling capacitor connected to said second node, wherein
said input signal and said reference signal are respectively transmitted to said first and second nodes respectively through said first and second coupling capacitors.

6. A signal level conversion circuit generating an output signal based on a correlationship between potentials of an input signal and a reference signal, comprising:

a differential amplification circuit amplifying a potential difference between first and second nodes for generating said output signal;

a first low pass filter transmitting a frequency component of at most a prescribed frequency of said input signal;

a first bias circuit applying a first bias potential to said first node according to an output potential of said first low pass filter;

a first high pass filter transmitting a frequency component of at least said prescribed frequency of said input signal to said first node; and a second bias circuit applying a second bias potential to said second node according to a potential level of said reference signal, wherein a relationship between said first bias potential and said output potential of said first low pass filter is similar to that between said second bias potential and said potential level of said reference signal.

7. The signal level conversion circuit according to claim 6, wherein
said first bias circuit maintains a potential at said first node at least to a prescribed potential regardless of a level of said input signal, said second bias circuit maintains a potential at said second node at least to said prescribed potential regardless of the level of said reference signal, said differential amplification circuit includes a plurality of transistors forming a current mirror amplifier, and said plurality of transistors operate in a saturation region when said potentials at said first and second nodes are at least said prescribed potentials.

8. The signal level conversion circuit according to claim 6, wherein said differential amplification circuit receives a first potential and a second potential higher than said first potential for operation, said first high pass filter includes a coupling capacitor connected between a node supplied with said input signal and said first node, and a resistance between a node supplying said first potential and said first node in said first bias circuit, and a capacitance value of said coupling capacitor is set in accordance with said prescribed frequency and a resistance value of said resistor.

9. The signal level conversion circuit according to claim 6, further comprising:

a second low pass filter transmitting a frequency component of at most said prescribed frequency of said reference signal; and a second high pass filter transmitting a frequency component of at least said prescribed frequency of said reference signal to said second node, wherein
said second bias circuit outputs said second bias potential in accordance with an output potential of said second low pass filter.

10. A semiconductor device receiving an external signal for operation, comprising an input buffer generating an internal signal based on a correlationship between potentials of said external signal and a reference signal, said buffer including:

a differential amplification circuit amplifying a potential difference between a first node supplied with said external signal and a second node supplied with said reference signal for generating said internal signal; and a bias circuit applying a bias potential independent of said internal signal to each of said first and second nodes.

* * * * *